United States Patent
Renau et al.

(10) Patent No.: US 7,161,161 B2
(45) Date of Patent: Jan. 9, 2007

(54) UNIFORMITY CONTROL USING MULTIPLE FIXED WAFER ORIENTATIONS AND VARIABLE SCAN VELOCITY

(75) Inventors: Anthony Renau, W. Newbury, MA (US); Joseph C. Olson, Beverly, MA (US); Donna L. Smatlak, Belmont, MA (US); Jun Lu, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 64 days.

(21) Appl. No.: 11/008,764

(22) Filed: Dec. 8, 2004

(65) Prior Publication Data

US 2005/0258379 A1 Nov. 24, 2005

Related U.S. Application Data

(60) Provisional application No. 60/528,083, filed on Dec. 9, 2003.

(51) Int. Cl.
*G21K 5/10* (2006.01)
(52) U.S. Cl. ............... 250/492.21; 250/492.2; 250/492.3; 250/398
(58) Field of Classification Search ............. None
See application file for complete search history.

(56) References Cited

U.S. PATENT DOCUMENTS

| 6,677,599 | B1 | 1/2004 | Berrian |
| 6,992,309 | B1* | 1/2006 | Petry et al. ............ 250/492.21 |
| 2001/0032937 | A1 | 10/2001 | Berrian | |

* cited by examiner

*Primary Examiner*—Jack Berman
*Assistant Examiner*—Zia R. Hashmi
(74) *Attorney, Agent, or Firm*—Varian Semiconductor Equipment Associates, Inc.

(57) ABSTRACT

A system, method and program product for enhancing dose uniformity during ion implantation are disclosed. The present invention is directed to allowing the use of an at least partially un-tuned ion beam to obtain a uniform implant by scanning the beam in multiple rotationally-fixed orientations (scan directions) of the target at variable or non-uniform scan velocities. The non-uniform scan velocities are dictated by a scan velocity profile that is generated based on the ion beam profile and/or the scan direction. The beam can be of any size, shape or tuning. A platen holding a wafer is rotated to a new desired rotationally-fixed orientation after a scan, and a subsequent scan occurs at the same scan velocity profile or a different scan velocity profile. This technique may be used independently or in conjunction with other uniformity approaches to achieve the required level of uniformity.

22 Claims, 7 Drawing Sheets

UNIFORMITY CONTROL USING MULTIPLE FIXED WAFER ORIENTATIONS AND VARIABLE SCAN VELOCITY

This application claims the benefit of U.S. Provisional Application No. 60/528,083, filed Dec. 9, 2003.

BACKGROUND OF THE INVENTION

1. Technical Field

The described invention relates generally to controlling dose uniformity during ion implantation. More particularly, the described invention is directed to controlling the uniformity and dose of a semiconductor wafer by using variable scan velocity in multiple scan directions and is particularly suited for low energy implant applications.

2. Related Art

Ion implantation processes typically require a uniform and consistent dose or amount of ions to be implanted into a semiconductor wafer. Dose is generally a function of ion beam current density and time that the wafer spends in front of an ion beam. Current serial implanters provide an ion beam that is horizontally either an electrostatically scanned spot beam or a uniform ribbon beam. Serial implanters may also use a magnetically scanned spot beam, and a dual mechanically scanned (raster) spot beam. One conventional approach provides a horizontally uniform ion beam, and then mechanically moves the wafer at a constant velocity in the vertical direction. In another conventional approach, the wafer is moved vertically and the ion beam is moved back-and-forth across the wafer. Unfortunately, both of these approaches are problematic for the low energy market because the beam has to be manipulated, which requires continual tuning of the ion beam. As a result, the required implant time is increased and wafer throughput is decreased.

One approach to address this situation is disclosed in U.S. Pat. No. 6,677,599 to Berrian. Under this approach, a wafer is translated at a non-uniform velocity through the ion beam as it is simultaneously rotated at a rotational velocity. A shortcoming of this device is that the constant rotation of the wafer introduces unnecessary complexity into attaining a uniform dose. Constant rotation also introduces to two other problems. First, maintaining constant tilt and wafer orientation is very difficult. In particular, the wafer holder needs to rotate around its axis for any tilted implant, which greatly complicates the mechanism. Second, continuous rotation of a product wafer has been shown to damage the product wafer a couple of different ways. First, fine scale structures on the wafer may not have sufficient structural integrity to withstand the centripetal acceleration, and, second, the rotation greatly adds to the kinetic energy when particles collide with the wafer surface and enhance the destructive potential of the particles.

In view of the foregoing, an approach is desired for allowing the use of an at least partially un-tuned beam to be used to attain a uniform implant without the problems of the related art.

SUMMARY OF THE INVENTION

The invention includes a system, method and program product for enhancing dose uniformity during ion implantation. The present invention is directed to allowing the use of an at least partially un-tuned ion beam to obtain a uniform implant by scanning the beam in multiple rotationally-fixed orientations (scan directions) of the target at variable scan velocities. The non-uniform scan velocities are dictated by a scan velocity profile that is generated based on the ion beam profile. The beam can be of any size, shape or tuning. A platen holding a wafer is rotated to a new desired rotationally-fixed orientation after a scan, and a subsequent scan occurs at the same scan velocity profile or a different scan velocity profile. This technique may be used independently or in conjunction with other uniformity approaches to achieve the required level of uniformity.

A first aspect of the invention is directed to a method for conducting uniform dose ion implantation of a target with an ion beam, the method comprising the steps of: providing an ion beam; determining an ion beam profile of the ion beam; determining a scan velocity profile based on the ion beam profile, the scan velocity profile dictating a non-uniform scan velocity across the target to provide a uniform dose; implanting the target using the ion beam including varying a scan velocity according to the scan velocity profile; rotating the target from a rotationally-fixed orientation about a location substantially at a center of the target to a subsequent rotationally-fixed orientation; and repeating the implanting step.

A second aspect of the invention is directed to an apparatus for conducting uniform dose ion implantation of a target with an ion beam, the apparatus comprising: a source of an ion beam for implanting the target, the ion beam having an ion beam profile; a target scan translator configured to move the target through the ion beam according to a scan velocity profile that is based on the ion beam profile, the scan velocity profile dictating a non-uniform scan velocity across the target; a target rotator configured to rotate the target from the rotationally-fixed orientation about a location substantially at a center of the target to a subsequent rotationally-fixed orientation between at least two implanting procedures; and a controller configured to operate the target scan translator and the target rotator to provide a substantially uniform dose of ions across the target.

A third aspect of the invention is directed to a computer program product comprising a computer useable medium having computer readable program code embodied therein for controlling an ion implanter system to provide a substantially uniform dose to a target, the ion implanter system including a target translator configured to move the target through the ion beam and a target rotator configured to rotate the target about a location substantially at a center of the target, the program product comprising: program code configured to determine an ion beam profile of the ion beam; program code configured to determine a scan velocity profile based on the ion beam profile, the scan velocity profile dictating a non-uniform scan velocity across the target to be used by the target translator to provide a substantially uniform dose to the target; and program code configured to determine whether to rotate the target using the target rotator between ion implant procedures from a rotationally-fixed orientation about a location substantially at a center of the target to a subsequent rotationally-fixed orientation.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
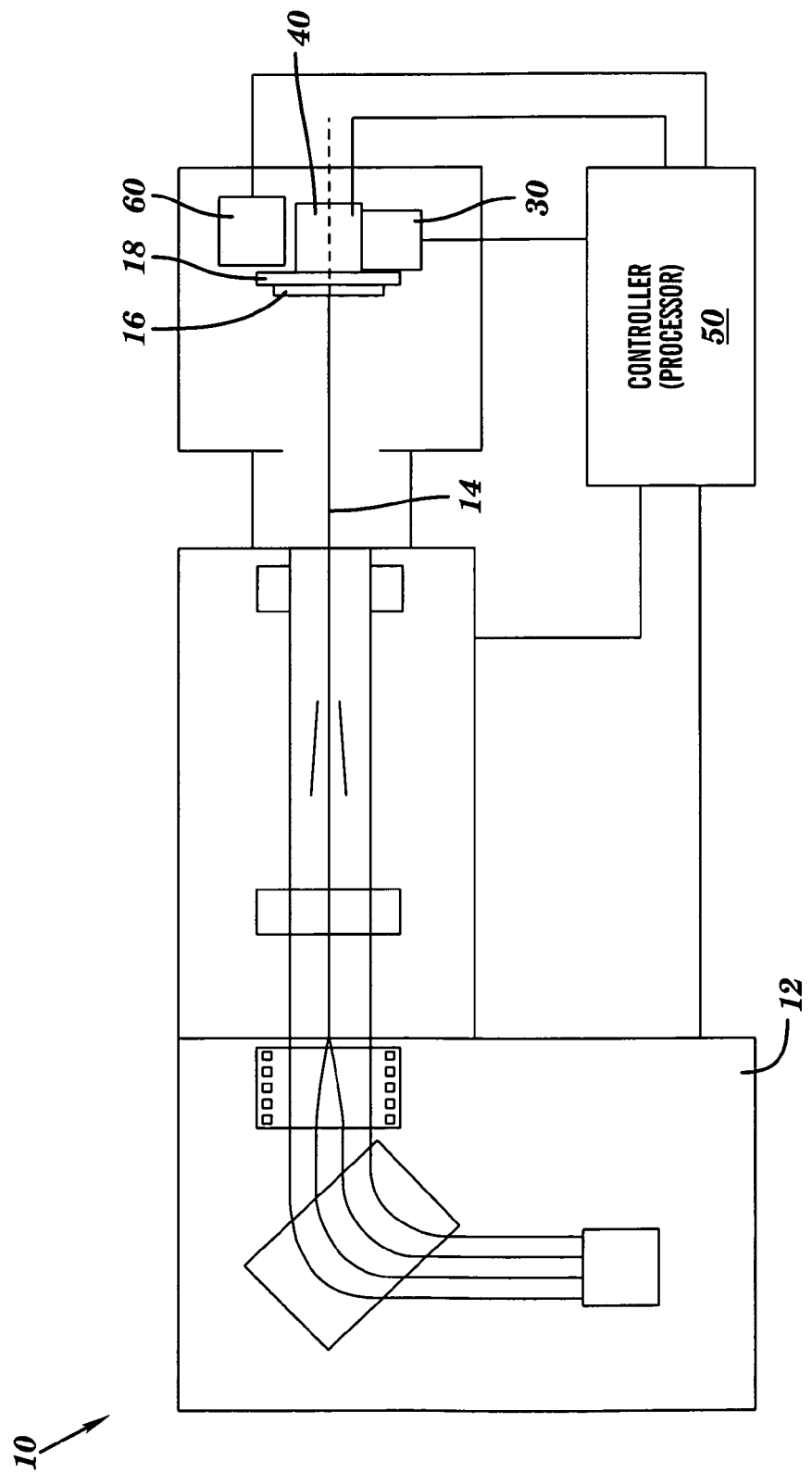
FIG. 1 shows a schematic of an ion implanter system according to the invention.

Referring to the drawings, FIG. 1 illustrates an ion implanter system 10 for conducting uniform dose ion implantation of a target (i.e., wafer) with an ion beam. According to the invention, an ion beam 14 is scanned across a target 16 at non-uniform or variable scan velocity under the control of a processor 50. Ion implanter system 10 includes, inter alia, a source 12 of ion beam 14 for implanting a target 16 that is mounted on a platen 18, a target scan translator 30, a target rotator 40 and processor 50.

Ion beam 14 may have any size or shape, and may be tuned or at least partially un-tuned according to the invention. However, the beam must have non-zero beam current at the position where the center of the target will be scanned. It is preferred, but not essential, that the beam is as wide as the target. If the beam is not as wide as the target, the number of orientations increases greatly. Ion beam 14 has an ion beam profile that indicates the ability of the ion beam to provide a uniform dose at various portions thereof. Ion beam profile may be one-dimensional or two-dimensional and may include, for example, current density across ion beam 14, and may be determined by processor 50 using a detector 60 such as a multi-pixel Faraday detector. More particularly, each scan path is discretized and ion beam 14 current is measured at each step in an embodiment of the present invention. The beam current is assumed to be stable or constant. Processor 50 is also configured to operate target scan translator 30 and target rotator 40 to provide a substantially uniform dose of ions across target 16, as will be described in more detail below.

Figure 2:
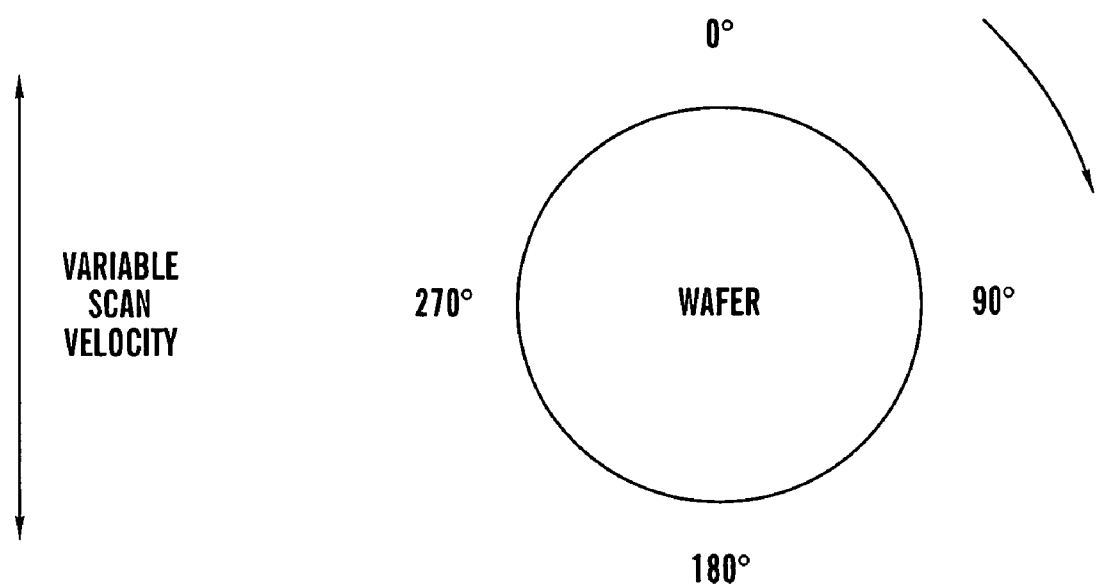
FIG. 2 shows orientations of a target.

Target scan translator 30 is configured to move target 16 through ion beam 14 in a translating fashion, i.e., into and out of page of FIG. 1, according to a scan velocity profile that is based on the ion beam profile. It should be recognized that moving target 16 through ion beam 14 can include: translationally moving the target 16, moving ion beam 14 across target 16, or a combination of both movements. The scan velocity profile dictates a non-uniform scan velocity to accommodate the ion beam imperfections as evidenced by the ion beam profile. Target rotator 40 is configured to rotate target 16 from the rotationally-fixed orientation about a location substantially at a center of the target to a subsequent rotationally-fixed orientation between at least two implanting scans. That is, between implanting scans, the scan direction is varied by rotating target 16. Any number of scan directions, i.e., wafer orientations, may be used. FIG. 2 shows one example of the present invention where four scan directions are performed by rotating the wafer through orientations of 0°, 90°, 180°, and 270°. In this embodiment, each rotation is for about 90°. In one embodiment, one scan velocity profile can be used for all scan directions based on the ion beam profile. However, a specific scan velocity profile for each scan based on the ion beam profile may be utilized in other aspects of the present invention.

With further regard to the scan velocity profile, in an alternative embodiment, the scan velocity profile may also be based on the rotationally-fixed orientation (scan direction) of the target. For instance, if the scan direction is not the first scan direction used, the amount of dose provided at the previous one or more scan directions can be considered to determine the new scan velocity profile, as will be described more fully below.

Figure 3:
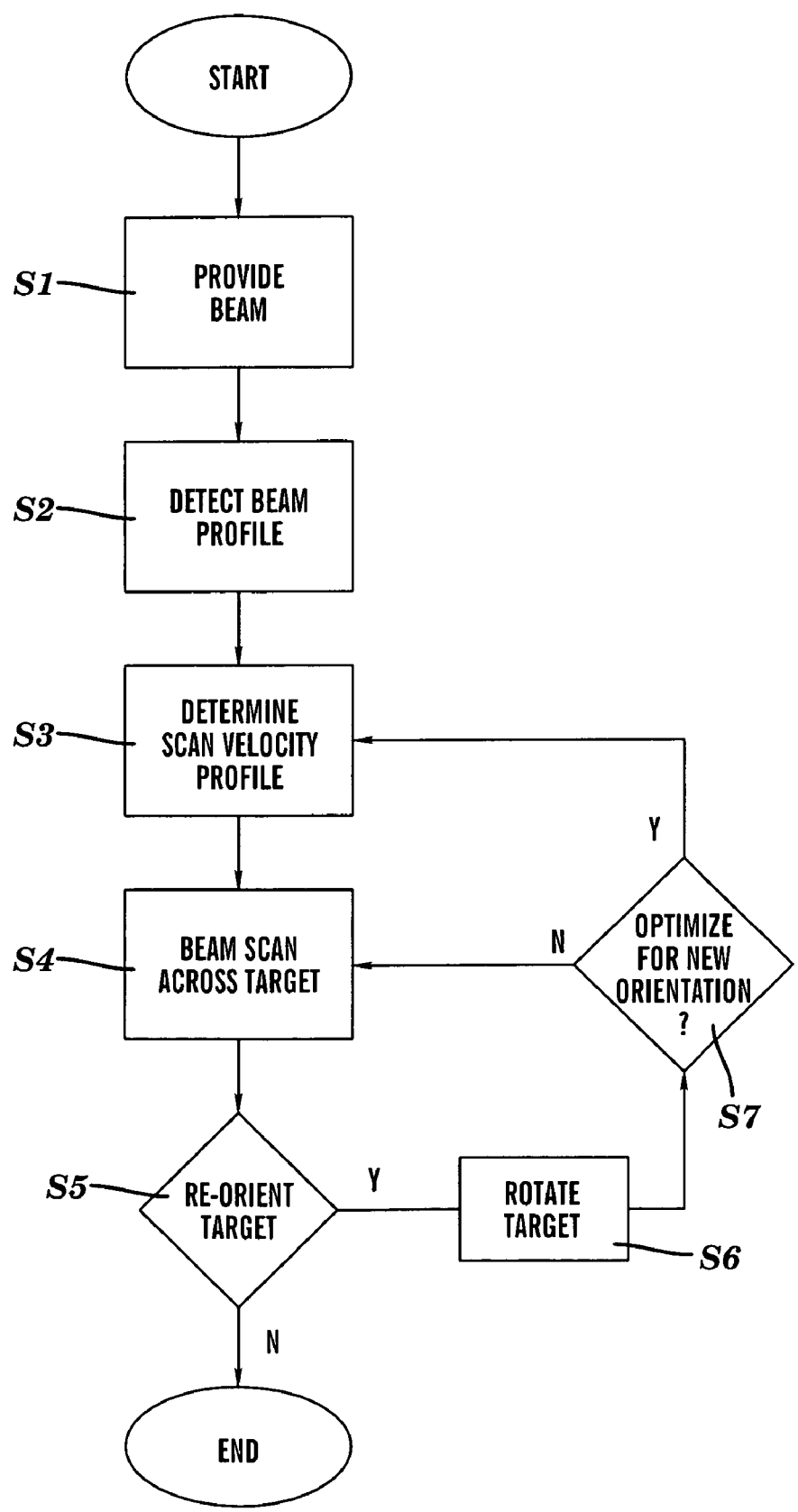
FIG. 3 shows a flow diagram of the operational methodology of the system of FIG. 1.

Referring to FIG. 3, a flow diagram of the operational methodology of system 10 will now be described in conjunction with the structure of FIG. 1. In a first step S1, ion beam 14 is provided in a conventional fashion. In a second step S2, the ion beam profile of the ion beam is determined by processor 50 measuring ion beam 14 using detector 60. Both steps S1 and S2 occur before the target is scanned.

Figure 4:
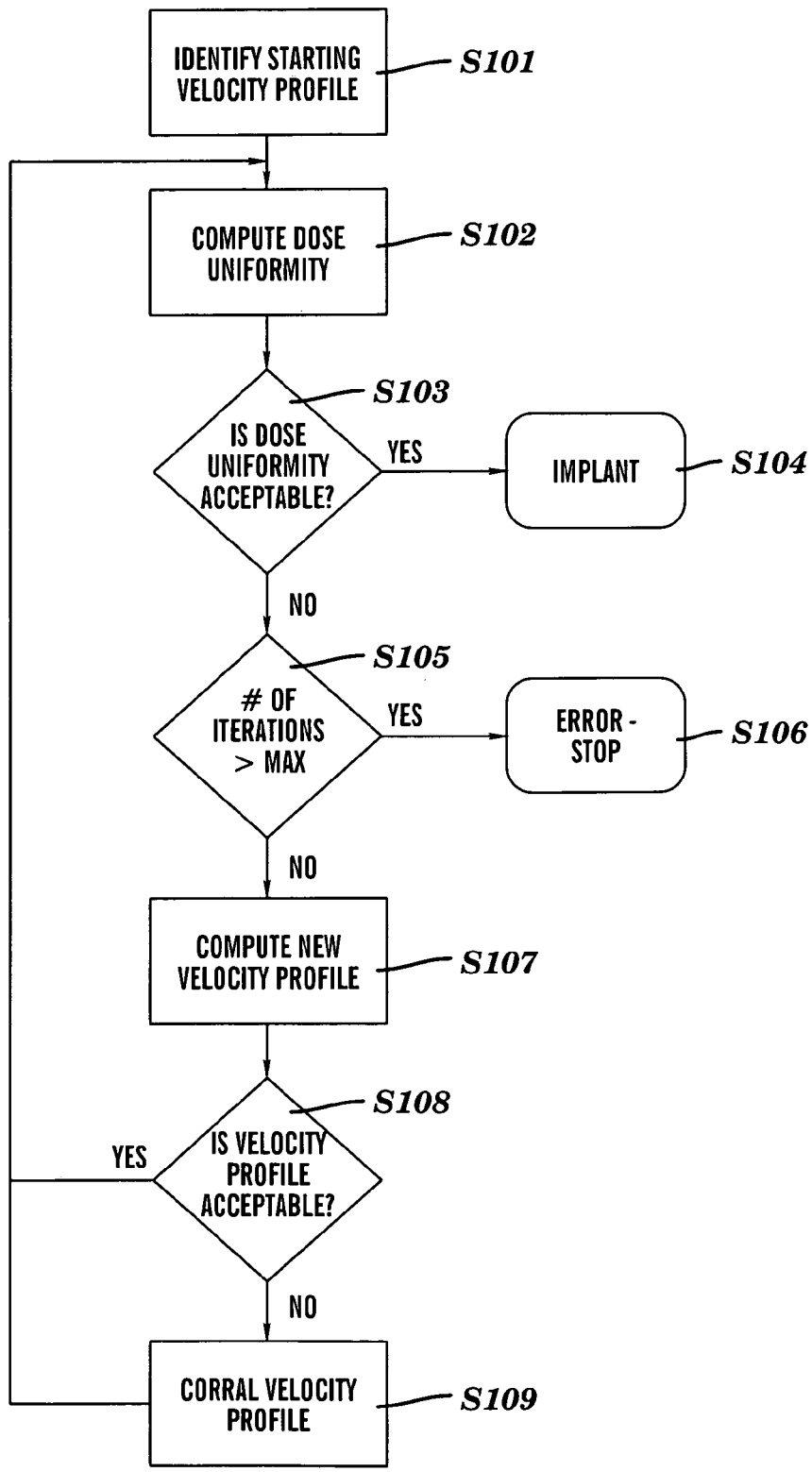
FIG. 4 shows a flow diagram of one embodiment for determining a scan velocity.

In step S3, a scan velocity profile is determined based on the ion beam profile by processor 50 (FIG. 2). As noted above, the scan velocity profile dictates a non-uniform scan velocity across the target to provide a uniform dose, which determines the time that ion beam 14 remains on each portion of target 16 and accordingly the dose. Use of multiple scan directions and non-uniform scan velocity may be combined with various search routines. A search routine may be iterative and convergent for modifying velocity and re-evaluating sigma distribution across the entire wafer. The variable scan velocity may be found in a number of ways, including a multi-dimensional search or solution of a set of coupled equations. FIG. 4 shows a flow diagram of one embodiment for determining the scan velocity using a multi-dimensional search method.

In a first step S101, a starting velocity profile is identified. Two examples of starting velocity profiles are a uniform velocity profile and a velocity profile that is proportional to the current in the beam profile, namely one that scans faster at positions corresponding to high beam currents and slower at positions corresponding to low beam currents.

In step S102, the dose on the wafer at each position is computed for the velocity profile combined with the ion beam profile information. The standard deviation of the calculated dose is also computed and used to evaluate the performance of the velocity profile.

In the next step S103, a determination is made as to whether the standard deviation meets the target criterion. If YES, the scan velocity profile is used to implant at step S104, i.e., step S4 of FIG. 3, described in more detail below. If NO, at step S105, a determination is made as to whether a number of allowed attempts to find a satisfactory velocity profile has been exceeded. If YES, then an error is indicated and processing stops at step S106. If NO at step S105, a new velocity profile is computed at step S107. This new velocity profile might be computed by making a systematic modification of the old profile, or might be computed by a textbook multi-dimensional search algorithm (such as downhill simplex).

At an optional step S108, a determination is made as to whether the new velocity profile is acceptable. For example, the new velocity profile may by tested for "smoothness" in order to limit the velocity excursions and wear on mechanical components. A smooth, slowly varying velocity profile is desirable because it limits the amount of acceleration, jerk (which is the derivative of acceleration) and loading on mechanical components such as motors and bearings. The scan system has a limited ability to follow really erratic velocity profiles, which tends to increase wear. Acceptable profiles may also be tested for calculated uniformity. If the new velocity profile is deemed unacceptable (e.g., insufficiently smooth), i.e., NO at step S108, then it is corralled, at step S109, and then re-tested via repetitions of steps S102–S108. If the new velocity profile is deemed acceptable, i.e., YES at step S108, then processing proceeds to repeat steps S102–S108. These steps are continued until the entire scan velocity profile is optimized for the required standard deviation of the dose uniformity.

Returning to FIG. 3, in step S4, target 16 is implanted using ion beam 14 including using a non-uniform or varying scan velocity, e.g., the velocity at which target translator 40 moves target 16, according to the scan velocity profile.

In step S5, a determination is made as to whether a rotating of target 16 is required. In one preferred embodiment, this determination is simply ascertaining how many scan directions were specified by a user. However, other more complex determinations based on the dose previously applied may be implemented, if desired. If YES at step S5, then at step S6, target 16 is rotated from a rotationally-fixed orientation about a location substantially at a center of the target to a subsequent rotationally-fixed orientation, as shown in FIG. 2, to provide a new scan direction. If NO at step S5, then processing ends.

Step S7 represents an optional step in which a determination as to whether to change the scan velocity profile is desired or necessary after rotating (step S5) to the subsequent rotationally-fixed orientation (scan direction). This determination can be triggered by any desired operational parameter of system 10 exceeding (equal, above or below) a threshold. In one example, beam instability as indicated by the average current density of the ion beam profile exceeding a threshold may be used. In an alternative embodiment, this determination can simply be user specified, e.g., use the new scan velocity profile every two rotations. If it is determined that the scan velocity profile is to be changed, i.e., YES at step S7, the scan velocity determining step S3 is repeated. In this case, the scan velocity profile may be different for a subsequent implanting step.

If NO at step S7, or after a new scan velocity profile is determined (step S3), the implanting step S4 is repeated for the new rotationally-fixed orientation (scan direction). Processing may then continue to repeat steps S3–S7 for as many scan directions as desired. Conventional glitch recovery techniques may be employed where necessary.

Figure 5A:
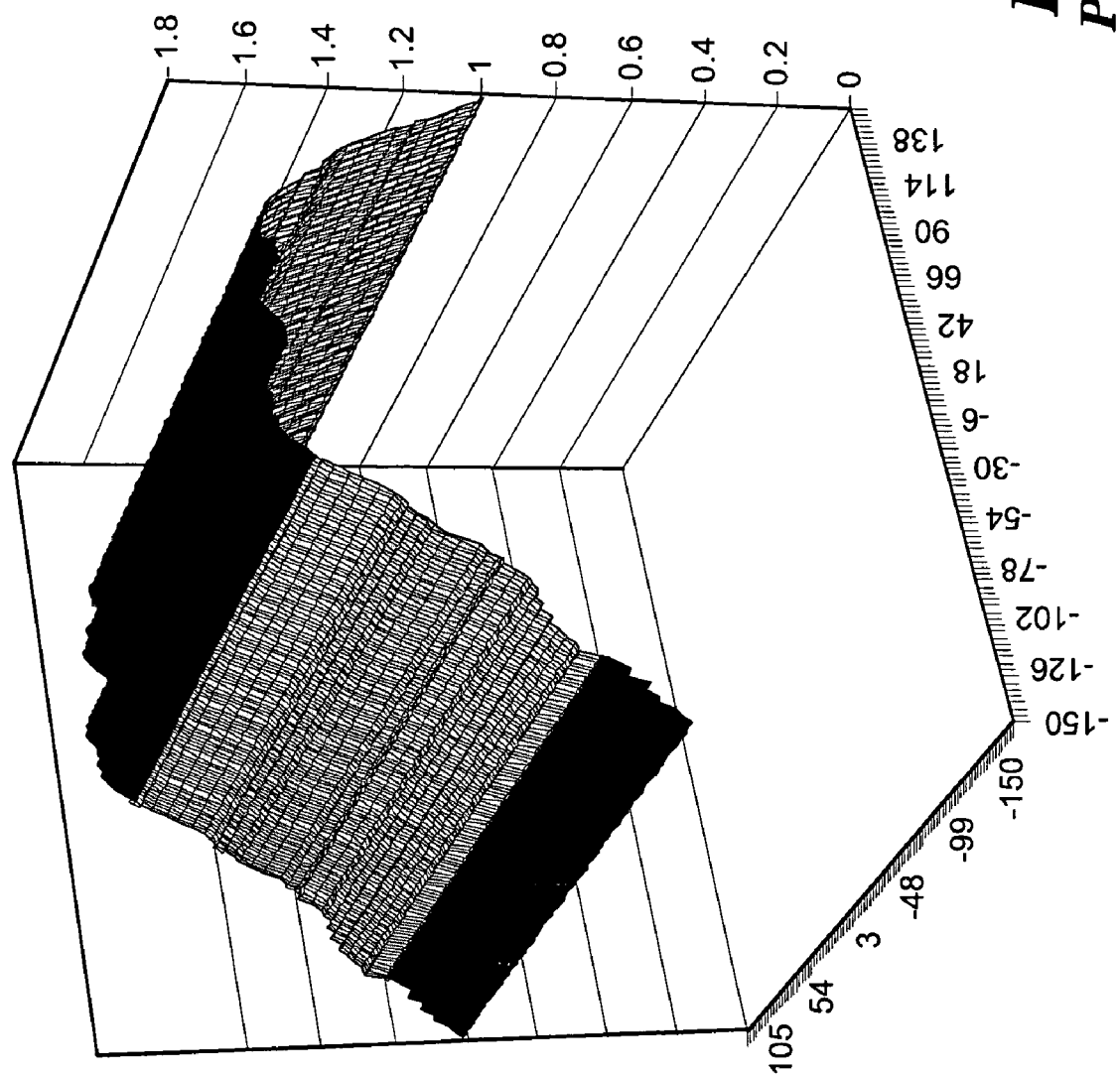
FIG. 5A shows a dose uniformity graph for a conventional single pass implant at a constant scan velocity.
Figure 5B:
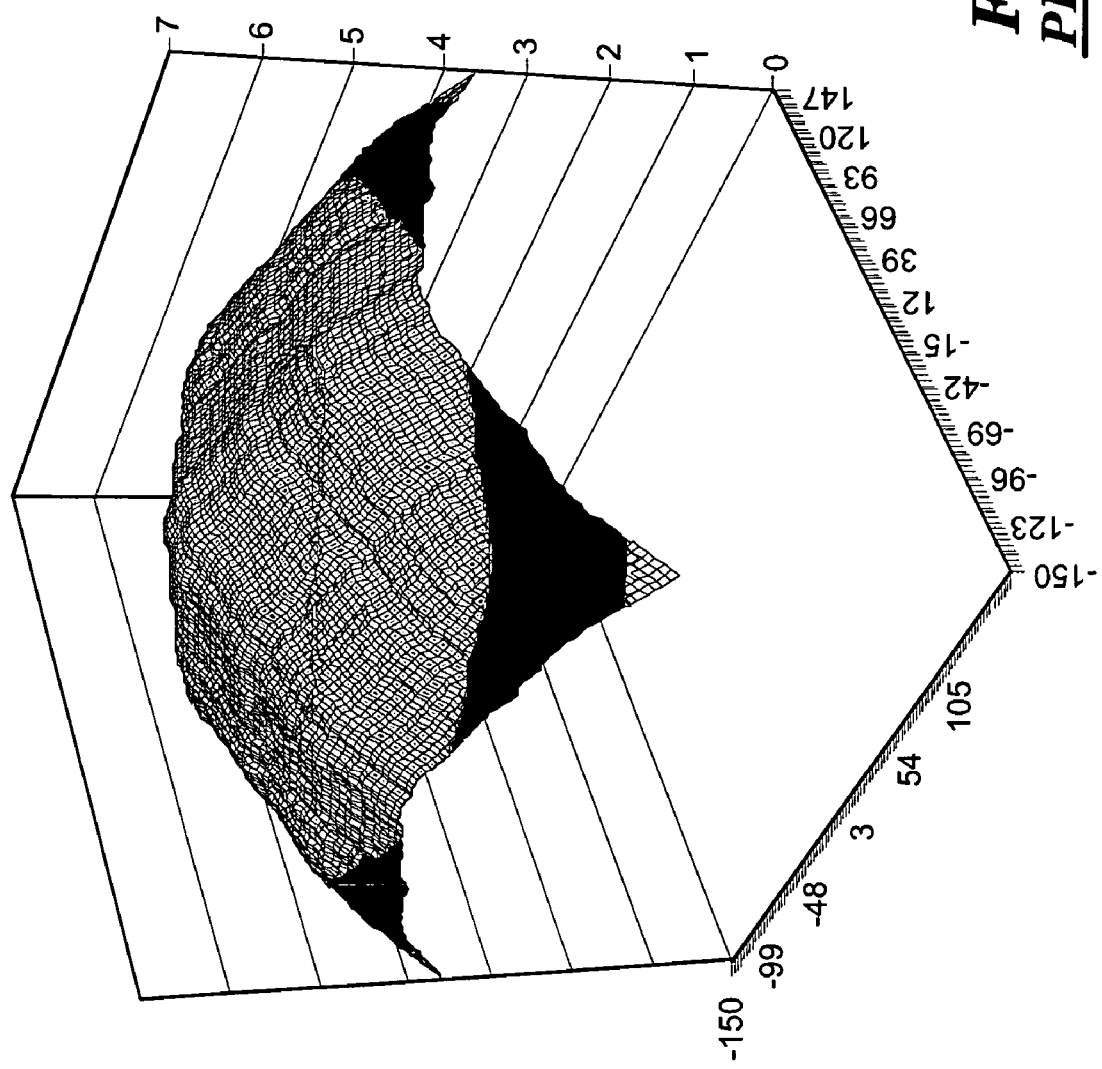
FIG. 5B shows a cumulative dose uniformity graph for a conventional four pass implant at a constant scan velocity.
Figure 5C:
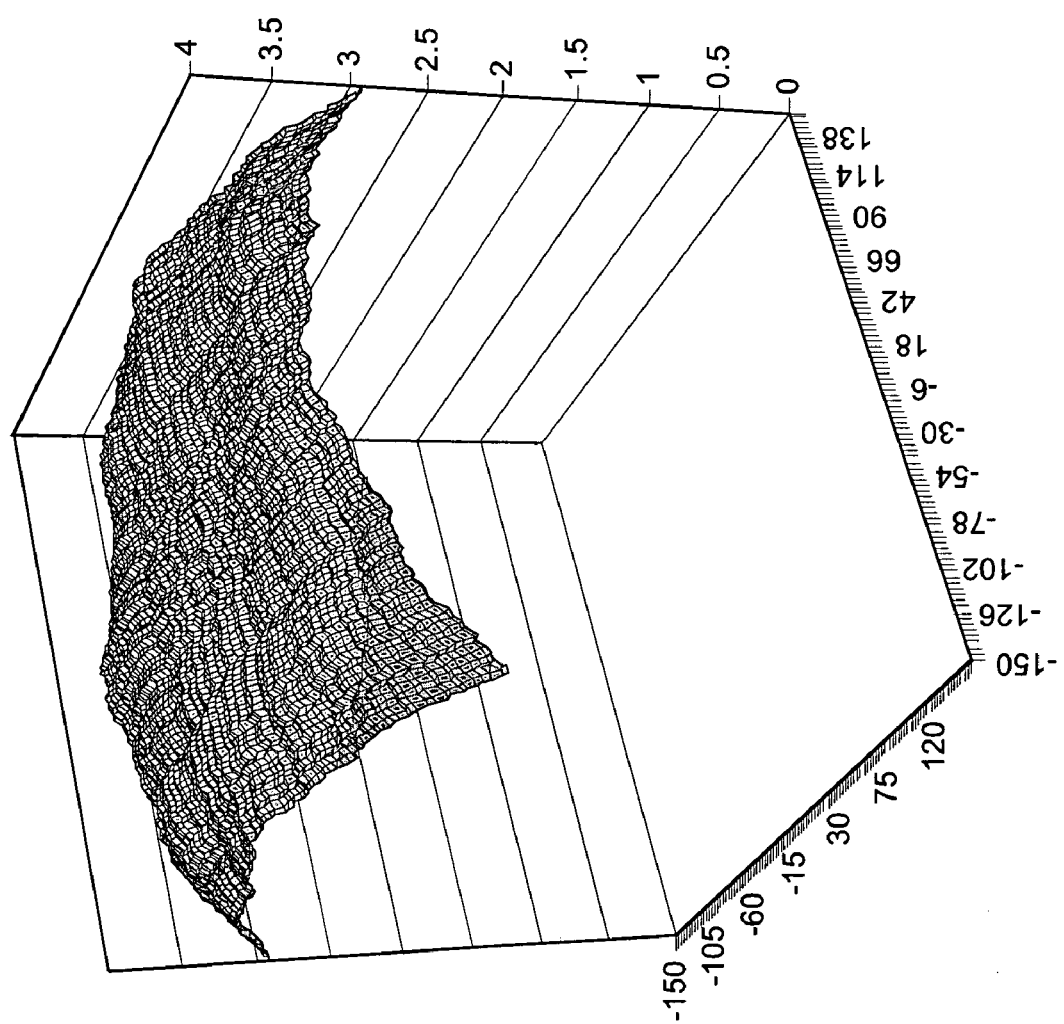
FIG. 5C shows a cumulative dose uniformity graph for a four pass implant using a non-uniform scan velocity based on an ion beam profile according to the invention.

The above-described approach utilizing multiple scan directions and variable scan velocity may realize improved dose uniformity (for example, within a sigma <1% (not shown)) with an un-tuned or partially tuned beam while maintaining a high throughput of wafers. FIGS. 5A, 5B and 5C illustrate dose uniformities for various implanting methods. FIG. 5A shows a conventional single pass implant at a constant scan velocity. FIG. 5B shows a conventional four pass implant where each of the passes is scanned at a constant scan velocity. A four pass implant according to one embodiment of the present invention is shown in FIG. 5C where each of the passes is scanned at a variable scan velocity that is determined based on the detected ion beam profile. A comparison of FIGS. 5B and 5C illustrates the improved dose uniformity realized according to the present invention. The above-described approach may also be used independently or in conjunction with other uniformity approaches to achieve the required level of uniformity.

In the previous discussion, it will be understood that the method steps discussed are performed by processor 50 executing instructions of a program product stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

Variations of the methods, systems and apparatus as described above may be realized by one skilled in the art. Although the methods, apparatus and systems have been described relative to specific embodiments thereof, they are not so limited. Obviously many modifications and variations may become apparent in light of the above teachings. Many additional changes in the details, materials, and arrangement of the parts and algorithms, herein described and illustrated, can be made by those skilled in the art. Accordingly, it will be understood that the present invention is not to be limited to the embodiments disclosed herein, can include practices otherwise than specifically described, and are to be interpreted as broadly as allowed under the law.

What is claimed is:

1. A method for conducting uniform dose ion implantation of a target with an ion beam, the method comprising the steps of:
   providing an ion beam;
   determining an ion beam profile of the ion beam;
   determining a scan velocity profile based on the ion beam profile, the scan velocity profile dictating a non-uniform scan velocity across the target to provide a uniform dose;
   implanting the target using the ion beam including varying a scan velocity according to the scan velocity profile;
   rotating the target from a rotationally-fixed orientation about a location substantially at a center of the target to a subsequent rotationally-fixed orientation; and
   repeating the implanting step.

2. The method of claim 1, further comprising the steps of:
   repeating the rotating step after the repeated implanting step;
   determining whether to change the scan velocity profile after the repeated rotating step for the subsequent rotationally-fixed orientation; and
   repeating the scan velocity profile determining step in the case that the scan velocity profile is to be changed such that the scan velocity profile is different for a subsequent implanting step.

3. The method of claim 2, wherein the scan velocity profile is also based on the rotationally-fixed orientation of the target.

4. The method of claim 2, wherein the scan velocity profile change determination includes determining whether an average current density exceeds a threshold.

5. The method of claim 1, wherein the rotation is about 90°.

6. The method of claim 1, wherein the ion beam profile determining step includes measuring the ion beam using a multi-pixel Faraday detector.

7. The method of claim 1, wherein the ion beam is at least partially un-tuned.

8. The method of claim 1, wherein the ion beam profile includes a current density.

9. The method of claim 1, wherein the scan velocity profile determining step includes:
identifying a starting scan velocity profile;
computing a dose on the target at each position for the scan velocity profile combined with the ion beam profile, and computing a standard deviation of the dose;
determining whether the standard deviation meets a target criterion;
in the case that the standard deviation meets the target criterion, proceeding with the implanting step, otherwise determining whether a number of allowed attempts to find a satisfactory scan velocity profile has been exceeded; and
in the case that the number of allowed attempts has been exceeded, indicating an error, otherwise computing a new scan velocity profile.

10. The method of claim 9, further comprising the step of determining whether the new scan velocity profile is acceptable and corralling the new scan velocity profile if the new scan velocity profile is unacceptable.

11. The method of claim 10, further comprising the steps of repeating the scan velocity determining step in the case that the new scan velocity profile is corralled or acceptable.

12. The method of claim 9, wherein the new scan velocity profile computing step includes one of making a systematic modification of the starting scan velocity profile, and computing a multi-dimensional search algorithm.

13. An apparatus for conducting uniform dose ion implantation of a target with an ion beam, the apparatus comprising:
a source of an ion beam for implanting the target, the ion beam having an ion beam profile;
a target scan translator configured to move the target through the ion beam according to a scan velocity profile that is based on the ion beam profile, the scan velocity profile dictating a non-uniform scan velocity across the target;
a target rotator configured to rotate the target from the rotationally-fixed orientation about a location substantially at a center of the target to a subsequent rotationally-fixed orientation between at least two implanting scans; and
a processor configured to operate the target scan translator and the target rotator to provide a substantially uniform dose of ions across the target.

14. The apparatus of claim 13, wherein the processor further operates to determine whether to change the scan velocity profile after the target rotator rotates the target to the subsequent rotationally-fixed orientation.

15. The apparatus of claim 13, wherein the scan velocity profile is also based on the rotationally-fixed orientation of the target.

16. The apparatus of claim 13, wherein the target rotator rotates the target about 90°.

17. The apparatus of claim 13, wherein the ion beam is at least partially un-tuned.

18. The apparatus of claim 13, wherein the ion beam profile includes a current density.

19. The apparatus of claim 13, further comprising means for determining the scan velocity profile including:
means for identifying a starting scan velocity profile;
means for computing a dose on the target at each position for the scan velocity profile combined with the ion beam profile, and computing a standard deviation of the dose;
means for determining whether the standard deviation meets a target criterion;
means for determining whether a number of allowed attempts to find a satisfactory scan velocity profile has been exceeded in the case that the standard deviation does not meet the target criterion, and otherwise proceeding with implanting; and
means for computing a new scan velocity profile in the case that the number of allowed attempts has not been exceeded, and otherwise indicating an error.

20. The apparatus of claim 19, further comprising means for determining whether the new scan velocity profile is acceptable and corralling the new scan velocity profile if the new scan velocity profile is unacceptable.

21. The apparatus of claim 19, wherein the new scan velocity profile computing means includes one of: means for making a systematic modification of the starting scan velocity profile, and means for computing a multi-dimensional search algorithm.

22. A computer program product comprising a computer useable medium having computer readable program code embodied therein for controlling an ion implanter system to provide a substantially uniform dose to a target, the ion implanter system including a target translator configured to move the target through the ion beam and a target rotator configured to rotate the target about a location substantially at a center of the target, the program product comprising:
program code configured to determine an ion beam profile of the ion beam;
program code configured to determine a scan velocity profile based on the ion beam profile, the scan velocity profile dictating a non-uniform scan velocity across the target to be used by the target translator to provide a substantially uniform dose to the target; and
program code configured to determine whether to rotate the target using the target rotator between ion implant procedures from a rotationally-fixed orientation about a location substantially at a center of the target to a subsequent rotationally-fixed orientation.

* * * * *